United States Patent
Lu et al.

(10) Patent No.: US 8,515,698 B2
(45) Date of Patent: Aug. 20, 2013

(54) DIGITAL POWER METER COMMUNICATION SYSTEM, METHOD AND COMPUTER-READABLE STORAGE MEDIUM FOR STORING THEREOF

(75) Inventors: Hsueh-Han Lu, Xinzhuang (TW); Tzu-Che Huang, Taipei (TW)

(73) Assignee: Institute For Information Industry, Taipei (TW)

( * ) Notice: Subject to any disclaimer, the term of this patent is extended or adjusted under 35 U.S.C. 154(b) by 434 days.

(21) Appl. No.: 12/943,222

(22) Filed: Nov. 10, 2010

(65) Prior Publication Data

US 2012/0059608 A1     Mar. 8, 2012

(30) Foreign Application Priority Data

Sep. 2, 2010   (TW) ................. 99129707 A

(51) Int. Cl.
*G06F 19/00*   (2011.01)
(52) U.S. Cl.
USPC ................. 702/62; 702/57; 702/60
(58) Field of Classification Search
USPC ................. 702/57, 60–65; 324/500
See application file for complete search history.

(56) References Cited

U.S. PATENT DOCUMENTS

| | | | | |
|---|---|---|---|---|
| 6,745,138 B2 * | 6/2004 | Przydatek et al. | ............. | 702/61 |
| 7,415,368 B2 * | 8/2008 | Gilbert et al. | ................. | 702/61 |

* cited by examiner

*Primary Examiner* — Jonathan C Teixeira Moffat
*Assistant Examiner* — Hien Vo
(74) *Attorney, Agent, or Firm* — McClure, Qualey & Rodack, LLP

(57) ABSTRACT

A digital power meter communication system includes terminal network communication devices, at least one concentrator network communication device and a digital power meter communication device. The digital power meter communication device is electrically connected with the at least one concentrator network communication device. Each of the terminal network communication devices is electrically connected with a terminal digital power meter. The digital power meter communication device includes a storage unit and a processing unit. The storage unit stores pieces of electrical connection information and digital power meter communication programs. The processing unit constructs a virtual tunnel to build connection with the target network communication device through the network. The processing unit executes the digital power meter communication instruction utilizing a target power meter communication program stored in the storage unit, which corresponds to the target digital power meter, through the virtual tunnel to communicate with the target digital power meter.

21 Claims, 2 Drawing Sheets

DIGITAL POWER METER COMMUNICATION SYSTEM, METHOD AND COMPUTER-READABLE STORAGE MEDIUM FOR STORING THEREOF

RELATED APPLICATIONS

This application claims priority to Taiwan Application Serial Number 099129707, filed Sep. 2, 2010, which is herein incorporated by reference.

BACKGROUND

1. Technical Field

The present invention relates to a power meter communication system, method and computer-readable storage medium with a computer program to execute thereof. More particularly, the present invention relates to a digital power meter communication system, method and computer-readable storage medium with a computer program to execute thereof.

2. Description of Related Art

A power meter is a device that measures the amount of electrical energy consumed by a residence, business, or an electrically powered device. As time goes by, mechanical power meters are replaced with digital power meters gradually. Users can obtain energy consumption information at any time if digital power meters are utilized for energy consumption measurement, whereas users can obtain energy consumption information only at the time they receive power fee if mechanical power meters are utilized for energy consumption measurement. Besides, power providers can adjust strategies for providing power according to energy consumption information measured by digital power meters.

Digital power meters manufactured by different companies utilize different data formats, different communication protocols or different communication devices. Therefore, digital power meters manufactured by different companies can't be communicated utilizing one platform. However, power providers (such as Taiwan Power Company) have a need to utilize digital power meters manufactured by different companies to be communicated with a single platform.

SUMMARY

According to one embodiment of this invention, a digital power meter communication system is provided. In the digital power meter communication system, the target digital power meter can be communicated utilizing the corresponding digital power meter communication program, which is obtained according to the identification information of the target network communication device electrically connected with the target digital power meter. The digital power meter communication system includes several terminal network communication devices, at least one concentrator network communication device and a digital power meter communication device. The digital power meter communication device is electrically connected with the at least one concentrator network communication device. The at least one concentrator network communication device and the terminal network communication devices build connections with a network. Each of the terminal network communication devices is electrically connected with a terminal digital power meter. The digital power meter communication device includes a storage unit and a processing unit. The processing unit is electrically connected with the storage unit. The storage unit stores several pieces of electrical connection information and several digital power meter communication programs. Wherein, the pieces of the electrical connection information records electrical connections between the terminal network communication devices and the terminal digital power meters. Each of the digital power meter communication programs corresponds to a predefined digital power meter model. The processing unit includes an instruction receiving module, a tunnel constructing module, a determining module and a power meter communicating module. The instruction receiving module receives a digital power meter communication instruction to communicate with a target digital power meter, which is electrically connected with a target network communication device. The tunnel constructing module constructs a virtual tunnel to build connection with the target network communication device through the network connected with the at least one concentrator network communication device. The determining module determines if the target network communication device is one of the terminal network communication devices. If the target network communication device is one of the terminal network communication devices, the power meter communicating module obtains a target power meter communication program corresponding to the target digital power meter from the digital power meter communication programs stored in the storage unit according to the target network communication device, loads the obtained target power meter communication program, and executes the digital power meter communication instruction utilizing the target power meter communication program through the virtual tunnel to communicate with the target digital power meter.

According to another embodiment of this invention, a digital power meter communication method is provided. In the digital power meter communication method, the target digital power meter can be communicated utilizing the corresponding digital power meter communication program, which is obtained according to the identification information of the target network communication device electrically connected with the target digital power meter. The digital power meter communication method includes the following steps: a digital power meter communication instruction to communicate with a target digital power meter, which is electrically connected with a target network communication device, is received. A virtual tunnel is constructed to build connection with the target network communication device. A storage unit, which stores several pieces of electrical connection information and several digital power meter communication programs, is provided. Wherein, the pieces of the electrical connection information records electrical connections between the terminal network communication devices and the terminal digital power meters. Each of the digital power meter communication programs corresponds to a predefined digital power meter model. Determine if the target network communication device is one of the terminal network communication devices. If the target network communication device is one of the terminal network communication devices, a target power meter communication program corresponding to the target network communication device is obtained from the digital power meter communication programs stored in the storage unit according to the target network communication device. The obtained target power meter communication program is loaded. The digital power meter communication instruction is executed utilizing the target power meter communication program through the virtual tunnel to communicate with the target digital power meter.

Above all, the digital power meter communication program for communicating with the digital power meter to be communicated with can be loaded according to identification information of the network communication device electrically connected with the digital power meter to be communicated with. Therefore, digital power meters can be communicated without knowing standards or format applied by thereof. Besides, one digital power meter communication device can communicate with digital power meters with different models. Hence, models of digital power meters are not limited, which means models of terminal digital power meters for replacement or added terminal digital power meters may not limited in a digital power meter communication system.

These and other features, aspects, and advantages of the present invention will become better understood with reference to the following description and appended claims. It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
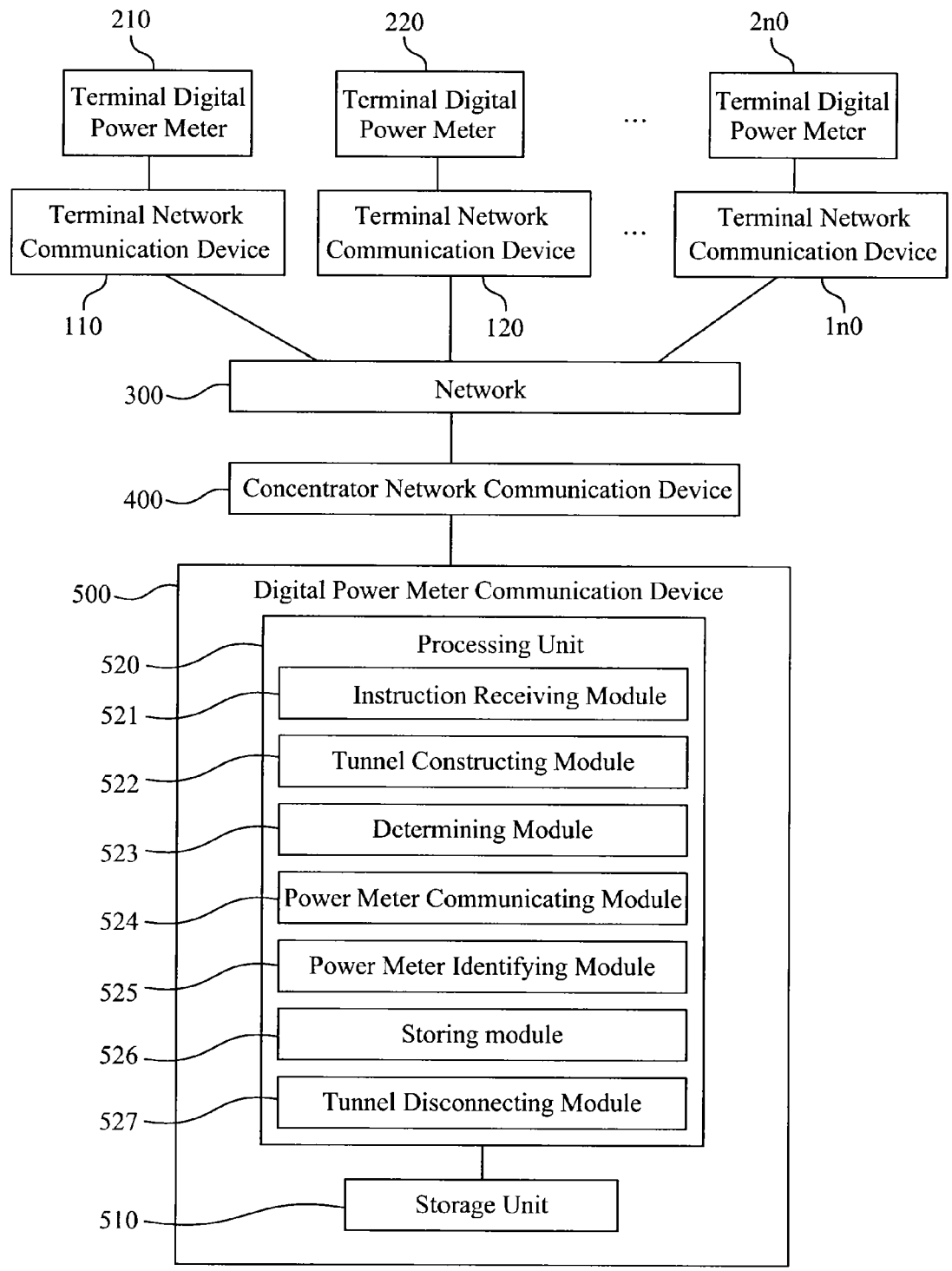
FIG. 1 is a block diagram of a digital power meter communication system according to one embodiment of this invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a block diagram of a digital power meter communication system according to one embodiment of this invention. In the digital power meter communication system, the target digital power meter can be communicated utilizing the corresponding digital power meter communication program, which is obtained according to the identification information of the target network communication device electrically connected with the target digital power meter.

The digital power meter communication system includes several terminal network communication devices 110, 120, ..., 1n0, at least one concentrator network communication device 400 and a digital power meter communication device 500. The digital power meter communication device 500 is electrically connected with the at least one concentrator network communication device 400. The at least one concentrator network communication device 400 and the terminal network communication devices 110, 120, ..., 1n0 may be wired network communication devices or wireless network communication devices to build connections with a network 300. Each of the terminal network communication devices 110, 120, ..., 1n0 is electrically connected with a terminal digital power meters 210, 220, ..., 2n0 respectively. The digital power meter communication device 500 includes a storage unit 510 and a processing unit 520, which are electrically connected with each other. The storage unit 510 stores several pieces of electrical connection information and several digital power meter communication programs. Wherein, the pieces of the electrical connection information records electrical connections between the terminal network communication devices 110, 120, ..., 1n0 and the terminal digital power meters 210, 220, ..., 2n0. Each of the digital power meter communication programs corresponds to a predefined digital power meter model. The storage unit 510 may be a non-volatile memory such as read only memory (ROM), programmable read only memory (PROM), an erasable programmable read only memory (EPROM), and electrically erasable programmable read only memory (EEPROM) devices; volatile memory such as SRAM, DRAM, and DDR-RAM; optical storage devices such as CD-ROMs and DVD-ROMs; and magnetic storage devices such as hard disk drives and floppy disk drives; databases accessed through network or any other storage unit.

The processing unit 520 includes an instruction receiving module 521, a tunnel constructing module 522, a determining module 523 and a power meter communicating module 524. The instruction receiving module 521 receives a digital power meter communication instruction to communicate with a target digital power meter, which is electrically connected with a target network communication device. In one embodiment, the digital power meter communication instruction may be a reading meter instruction to read values from the target digital power meter. In another embodiment, the digital power meter communication instruction may be a setting instruction to adjust the setting of the target digital power meter. In other embodiments, the digital power meter communication instruction may be other instructions to communicate with the target digital power meter. The tunnel constructing module 522 constructs a virtual tunnel to build connection with the target network communication device through the network 300 connected with the at least one concentrator network communication device 400. Wherein, there may be some risks of broken or interference if one digital power meter communicates with more than one digital power meter communication program. Hence, each of the terminal network communication devices 110, 120, ..., 1n0 can be connected with a virtual tunnel at the same time, which can avoid each of the terminal digital power meters 210, 220, ..., 2n0 electrically connected with the terminal network communication devices 110, 120, ..., 1n0 communicates with more than one digital power meter communication program at the same time.

The determining module 523 determines if the target network communication device is one of the terminal network communication devices 110, 120, ..., 1n0. If the target network communication device is one of the terminal network communication devices 110, 120, ..., 1n0, the power meter communicating module 524 obtains a target power meter communication program corresponding to the target digital power meter from the digital power meter communication programs stored in the storage unit 510 according to the target network communication device. Wherein, the power meter communicating module 524 can obtain the model name of the target digital power meter by checking the electrical connection information stored in the storage unit 510 according to the identification information of the target network communication device, which is electrically connected with the target digital power meter. Then, the power meter communicating module 524 can obtain and load the target power meter communication program corresponding to the target digital power meter from the digital power meter communication programs stored in the storage unit 510 according to the model name of the target digital power meter. The power meter communicating module 524 executes the digital power meter communication instruction utilizing the target power meter communication program through the virtual tunnel to communicate with the target digital power meter. Therefore, communication program for communicating with the target digital power meter can be loaded according to the identification information of the target network communication device, which is electrically connected with the target digital power meter. Hence, several different digital power meters can be communicated.

Besides, if the electrical connection information, which records the electrical connection between the target network communication device and the target digital power meter, is not stored in the storage unit 510, the power meter communication program corresponding to the target digital power meter can still be found out by transmitting a connection request to the target digital power meter utilizing one of the digital power meter communication programs stored in the storage unit 510 for reply. Therefore, the processing unit 520 may further includes a power meter identifying module 522. If the target network communication device is not one of the terminal network communication devices 110, 120, ..., 1n0, the power meter identifying module 525 selects one of the digital power meter communication programs stored in the storage unit 510. The power meter identifying module 525 transmits a power meter connection request to the target digital power meter through the virtual tunnel utilizing the selected digital power meter communication program to obtain a power meter connection reply from the target digital power meter. If the selected digital power meter communication program corresponds to the target digital power meter, the target digital power meter can handle the power meter connection request transmitted utilizing the selected digital power meter communication and reply a power meter connection reply. Hence, if the power meter connection reply is obtained from the target digital power meter, the power meter identifying module 525 identifies the selected digital power meter communication program as the one corresponds to the target digital power meter. Then, the power meter communicating module 524 can utilize the selected digital power meter communication program to executes the digital power meter communication instruction to communicate with the target digital power meter.

Besides, if the selected digital power meter communication program is identified as the one corresponds to the target digital power meter, the electrical connection information, which records electrical connection between the target network communication device and the corresponding model name of the selected digital power meter communication program, can be stored in the storage unit 510 for communication with the target digital power meter latter. Therefore, the processing unit 520 may further includes a storing module 526. When the selected digital power meter communication program is identified as the one corresponds to the target digital power meter, the storing module 526 for storing electrical connection information, which records electrical connection between the target network communication device and the corresponding model of the selected digital power meter communication program, into the storage unit 510.

If the power meter connection reply has not been obtained from the target digital power meter in a predefined time period, the power meter identifying module 525 identifies the selected digital power meter communication program as the one not corresponds to the target digital power meter. The power meter identifying module 525 utilizes another selected digital power meter communication program stored in the storage unit 510 to transmit the power meter connection request to the target digital power meter through the virtual tunnel. Therefore, the digital power meter communication program corresponding to the target digital power meter can be found out by utilizing the digital power meter communication programs stored in the storage unit 510 one by one to transmit a connection request to the target digital power meter for reply.

If the power meter connection reply has not been obtained from the target digital power meter in a predefined time period, the power meter identifying module 525 identifies the selected digital power meter communication program as the one not corresponds to the target digital power meter. The power meter identifying module 525 utilizes another selected digital power meter communication program stored in the storage unit 510 to transmit the power meter connection request to the target digital power meter through the virtual tunnel. Therefore, the corresponding digital power meter communication program of the target digital power meter can be found out utilizing the digital power meter communication programs stored in the storage unit one by one to transmit the power meter connection request.

Since each of the terminal network communication devices 110, 120, ..., 1n0 can be connected with a virtual tunnel respectively, the virtual tunnels can be disconnected to release the resource of the terminal digital power meters 210, 220, ..., 2n0 electrically connected with the terminal network communication devices 110, 120, ..., 1n0. Therefore, the processing unit 520 may further include a tunnel disconnecting module 527. When a disconnecting instruction is received, the tunnel disconnecting module 527 disconnects the virtual tunnel. Wherein, the disconnecting instruction may be generated after the digital power meter communication instruction is finished. Besides, users may generate the disconnecting instruction through a user interface. In another embodiment, the tunnel disconnecting module 527 may disconnect the virtual tunnel if another instruction has not been received in an idle time threshold. Therefore, after the virtual tunnel is disconnected, the terminal digital power meters 210, 220, ..., 2n0 electrically connected with the terminal network communication devices 110, 120, ..., 1n0 can be communicated with other digital power meter communication devices.

Figure 2:
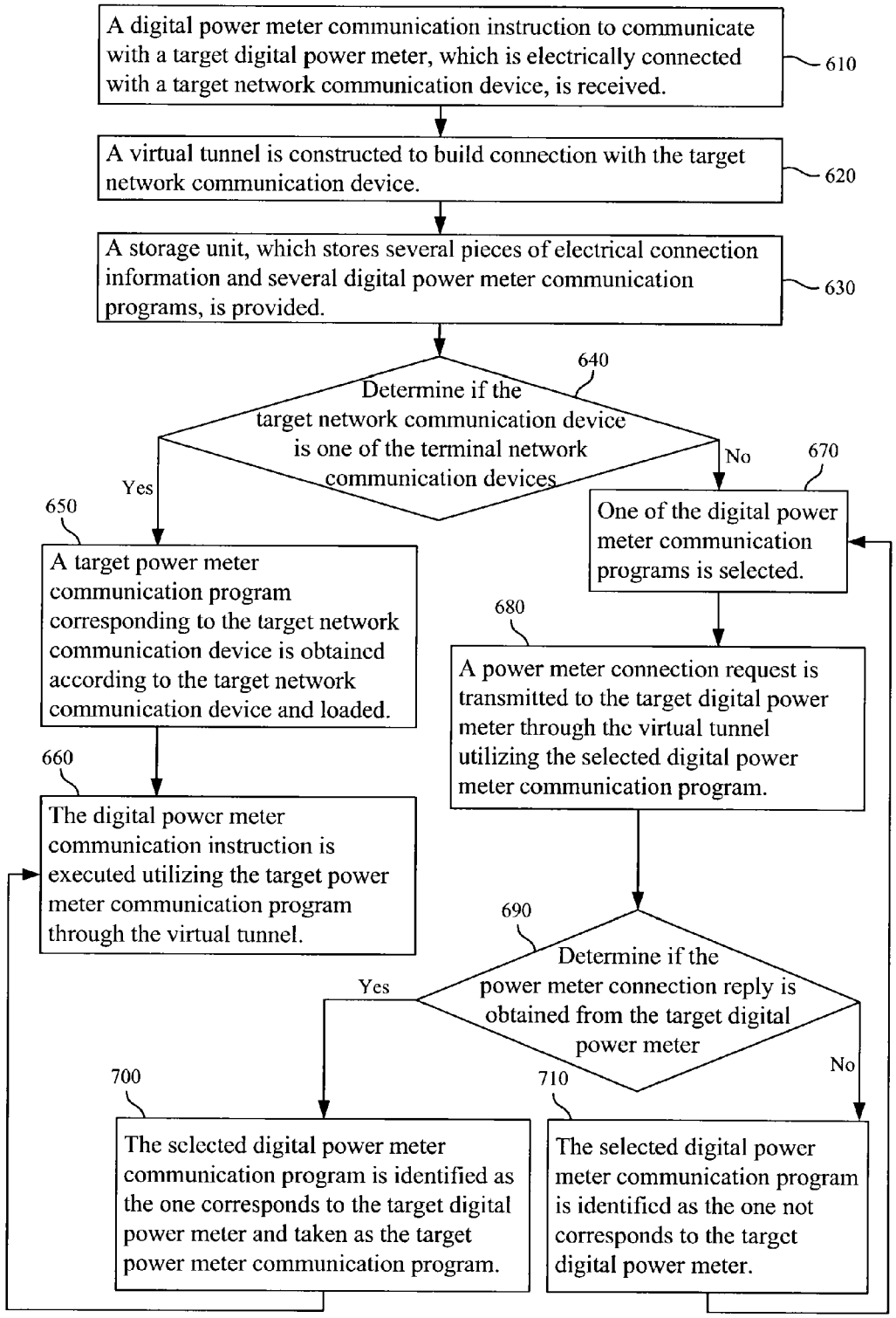
FIG. 2 is a flaw diagram of a digital power meter communication method according to one embodiment of this invention.

FIG. 2 is a flaw diagram of a digital power meter communication method according to one embodiment of this invention. In the digital power meter communication method, the target digital power meter can be communicated utilizing the corresponding digital power meter communication program, which is obtained according to the identification information of the target network communication device electrically connected with the target digital power meter. The digital power meter communication method may take the form of a computer program product stored on a computer-readable storage medium having computer-readable instructions embodied in the medium. Any suitable storage medium may be used including non-volatile memory such as read only memory (ROM), programmable read only memory (PROM), erasable programmable read only memory (EPROM), and electrically erasable programmable read only memory (EEPROM) devices; volatile memory such as SRAM, DRAM, and DDR-RAM; optical storage devices such as CD-ROMs and DVD-ROMs; and magnetic storage devices such as hard disk drives and floppy disk drives.

The digital power meter communication method includes the following steps:

In step 610, a digital power meter communication instruction to communicate with a target digital power meter, which is electrically connected with a target network communication device, is received. In one embodiment, the digital power meter communication instruction may be a reading meter instruction to read values from the target digital power meter.

In another embodiment, the digital power meter communication instruction may be a setting instruction to adjust the setting of the target digital power meter. In other embodiments, the digital power meter communication instruction may be other instructions to communicate with the target digital power meter.

In step 620, a virtual tunnel is constructed to build connection with the target network communication device. Wherein, the virtual tunnel can be constructed through a wired network, a wireless network or combination thereof.

In step 630, a storage unit, which stores several pieces of electrical connection information and several digital power meter communication programs, is provided. Wherein, the pieces of the electrical connection information records electrical connections between the terminal network communication devices and the terminal digital power meters. Each of the digital power meter communication programs corresponds to a predefined digital power meter model. Besides, if one digital power meter communicates with more than one digital power meter communication program at the same time, there may be some risks that the communicated digital power meter breaks down or is interfered by the digital power meter communication programs communicating with at the same time. Hence, each of the terminal network communication devices can be connected with a virtual tunnel at the same time, thereby preventing the case, "each of the terminal digital power meters, electrically connected with the terminal network communication devices, communicates with more than one digital power meter communication program at the same time".

In step 640, determine if the target network communication device is one of the terminal network communication devices.

If the target network communication device is one of the terminal network communication devices, the model name of the target digital power meter can be obtained by checking the electrical connection information stored in the storage unit according to the identification information of the target network communication device, which is electrically connected with the target digital power meter. Hence, in step 650, if the target network communication device is one of the terminal network communication devices, a target power meter communication program corresponding to the target network communication device is obtained from the digital power meter communication programs stored in the storage unit according to the target network communication device and the target power meter communication program is loaded. Wherein, the model name of the target digital power meter can be obtained by checking the electrical connection information stored in the storage unit according to the identification information of the target network communication device. Then, the target power meter communication program corresponding to the target digital power meter can be obtained and loaded from the digital power meter communication programs stored in the storage unit according to the model name of the target digital power meter (step 650).

In step 660, the digital power meter communication instruction is executed utilizing the target power meter communication program through the virtual tunnel to communicate with the target digital power meter. Therefore, a communication program for communicating with the target digital power meter can be loaded according to the identification information of the target network communication device, which is electrically connected with the target digital power meter. Hence, several different digital power meters can be communicated at the same platform utilizing the digital power meter communication method.

Besides, if the electrical connection information, which records the electrical connection between the target network communication device and the target digital power meter, is not stored in the storage unit, the power meter communication program corresponding to the target digital power meter can still be found out by transmitting a connection request to the target digital power meter utilizing the digital power meter communication programs stored in the storage unit one by one for reply. Hence, in step 670, if the target network communication device is not one of the terminal network communication devices, one of the digital power meter communication programs stored in the storage unit is selected.

In step 680, a power meter connection request is transmitted to the target digital power meter through the virtual tunnel utilizing the selected digital power meter communication program to obtain a power meter connection reply from the target digital power meter.

If the selected digital power meter communication program corresponds to the target digital power meter, the target digital power meter can handle the power meter connection request transmitted utilizing the selected digital power meter communication and reply a power meter connection reply. Hence, in step 690, determine if a power meter connection reply is obtained from the target digital power meter.

In step 700, if the power meter connection reply is obtained from the target digital power meter, the selected digital power meter communication program is identified as the one corresponds to the target digital power meter and taken as the target power meter communication program. Then, the target digital power meter can be communicated utilizing the target power meter communication program to execute the digital power meter communication instruction (step 660). Besides, the electrical connection information, which records electrical connection between the target network communication device and the corresponding model name of the selected digital power meter communication program, can be stored in the storage unit for communication with the target digital power meter latter. Therefore, if the selected digital power meter communication program is identified as the one corresponding to the target digital power meter, the electrical connection information, which records the electrical connection between the target network communication device and the corresponding model of the selected digital power meter communication program, can be stored into the storage unit.

In step 710, if the power meter connection reply has not been obtained from the target digital power meter in a predefined time period, the selected digital power meter communication program is identified as the one not corresponding to the target digital power meter. Then, another one of the digital power meter communication programs stored in the storage unit is selected (step 670), and the power meter connection request is transmitted to the target digital power meter through the virtual tunnel by utilizing another selected digital power meter communication program stored in the storage unit (step 680). Therefore, the corresponding digital power meter communication program of the target digital power meter can be found out by utilizing the digital power meter communication programs stored in the storage unit one by one to transmit the power meter connection request.

Since each of the terminal network communication devices can be connected with a virtual tunnel respectively, the virtual tunnels can be disconnected to release the resource of the terminal digital power meters electrically connected with the terminal network communication devices. Therefore, the digital power meter communication method may further include the step of disconnecting the virtual tunnel. When a disconnecting instruction is received, the virtual tunnel may be disconnected. Wherein, the disconnecting instruction may be generated after the digital power meter communication instruction is finished. Besides, users may generate the disconnecting instruction through a user interface. In another embodiment, the virtual tunnel may be disconnected if another instruction has not been received in an idle time threshold. Therefore, after the virtual tunnel is disconnected, the terminal digital power meters electrically connected with the terminal network communication devices can be communicated with other digital power meter communication devices.

Above all, the digital power meter communication program for communicating with the digital power meter to be communicated with can be loaded according to identification information of the network communication device electrically connected with the digital power meter to be communicated with. Therefore, digital power meters can be communicated without knowing standards or format applied by thereof. Besides, one digital power meter communication device can communicate with digital power meters with different models. Hence, models of digital power meters are not limited, which means models of terminal digital power meters for replacement or added terminal digital power meters may not limited in a digital power meter communication system.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A digital power meter communication system comprising:
   a plurality of terminal network communication devices for building connections with a network, wherein each of the terminal network communication devices is electrically connected with a terminal digital power meter;
   at least one concentrator network communication device for building a connection with the network; and
   a digital power meter communication device, electrically connected with the at least one concentrator network communication device, the digital power meter communication device comprising:
   a storage unit for storing a plurality of pieces of electrical connection information and a plurality of digital power meter communication programs, wherein the pieces of the electrical connection information records electrical connections between the terminal network communication devices and the terminal digital power meters, and each of the digital power meter communication programs corresponds to a predefined digital power meter model; and
   a processing unit electrically connected with the storage unit, the processing unit comprising:
   an instruction receiving module for receiving a digital power meter communication instruction to communicate with a target digital power meter, which is electrically connected with a target network communication device;
   a tunnel constructing module for constructing a virtual tunnel to build connection with the target network communication device through the network connected with the at least one concentrator network communication device;
   a determining module for determining if the target network communication device is one of the terminal network communication devices; and
   a power meter communicating module for obtaining a target power meter communication program corresponding to the target digital power meter from the digital power meter communication programs stored in the storage unit according to the target network communication device, loading the obtained target power meter communication program, and executing the digital power meter communication instruction utilizing the target power meter communication program through the virtual tunnel to communicate with the target digital power meter if the target network communication device is one of the terminal network communication devices.

2. The digital power meter communication system of claim 1, wherein the processing unit further comprises:
   a power meter identifying module for selecting one of the digital power meter communication programs stored in the storage unit and transmitting a power meter connection request to the target digital power meter through the virtual tunnel utilizing the selected digital power meter communication program to obtain a power meter connection reply from the target digital power meter if the target network communication device is not one of the terminal network communication devices, and identifying the selected digital power meter communication program as the one corresponds to the target digital power meter if the power meter connection reply is obtained from the target digital power meter.

3. The digital power meter communication system of claim 2, wherein the power meter identifying module is further adapted for identifying the selected digital power meter communication program as the one not corresponds to the target digital power meter if the power meter connection reply has not been obtained from the target digital power meter in a predefined time period, and for transmitting the power meter connection request to the target digital power meter through the virtual tunnel utilizing another selected digital power meter communication program stored in the storage unit.

4. The digital power meter communication system of claim 2, wherein the processing unit further comprising:
   a storing module for storing electrical connection information, which records electrical connection between the target network communication device and the corresponding model of the selected digital power meter communication program, into the storage unit when the selected digital power meter communication program is identified as the one corresponds to the target digital power meter.

5. The digital power meter communication system of claim 1, wherein the processing unit further comprising:
   a tunnel disconnecting module for disconnecting the virtual tunnel when a disconnecting instruction is received.

6. The digital power meter communication system of claim 1, wherein the processing unit further comprises:
   a tunnel disconnecting module for disconnecting the virtual tunnel if another instruction has not been received in an idle time threshold.

7. The digital power meter communication system of claim 1, wherein the digital power meter communication instruction is a reading meter instruction.

8. A digital power meter communication method, comprising:
- receiving a digital power meter communication instruction to communicate with a target digital power meter, which is electrically connected with a target network communication device;
- constructing a virtual tunnel to build connection with the target network communication device;
- providing a storage unit, which stores a plurality of pieces of electrical connection information and a plurality of digital power meter communication programs, wherein the pieces of the electrical connection information records electrical connections between the terminal network communication devices and the terminal digital power meters, and each of the digital power meter communication programs corresponds to a predefined digital power meter model;
- determining if the target network communication device is one of the terminal network communication devices; and
- obtaining a target power meter communication program corresponding to the target network communication device from the digital power meter communication programs stored in the storage unit according to the target network communication device, loading the obtained target power meter communication program, and executing the digital power meter communication instruction utilizing the target power meter communication program through the virtual tunnel to communicate with the target digital power meter if the target network communication device is one of the terminal network communication devices.

9. The digital power meter communication method of claim 8, further comprising:
- selecting one of the digital power meter communication programs stored in the storage unit and transmitting a power meter connection request to the target digital power meter through the virtual tunnel utilizing the selected digital power meter communication program to obtain a power meter connection reply from the target digital power meter if the target network communication device is not one of the terminal network communication devices; and
- identifying the selected digital power meter communication program as the one corresponds to the target digital power meter if the power meter connection reply is obtained from the target digital power meter.

10. The digital power meter communication method of claim 9, further comprising:
- identifying the selected digital power meter communication program as the one not corresponds to the target digital power meter if the power meter connection reply has not been obtained from the target digital power meter in a predefined time period; and
- transmitting the power meter connection request to the target digital power meter through the virtual tunnel utilizing another selected digital power meter communication program stored in the storage unit.

11. The digital power meter communication method of claim 9, further comprising:
- storing electrical connection information, which records the electrical connection between the target network communication device and the corresponding model of the selected digital power meter communication program, into the storage unit when the selected digital power meter communication program is identified as the one corresponds to the target digital power meter.

12. The digital power meter communication method of claim 8, further comprising:
- disconnecting the virtual tunnel when a disconnecting instruction is received.

13. The digital power meter communication method of claim 8, further comprising:
- disconnecting the virtual tunnel if another instruction has not been received in an idle time threshold.

14. The digital power meter communication method of claim 8, wherein the digital power meter communication instruction is a reading meter instruction.

15. A non-transitory computer-readable storage medium with a computer program to execute a digital power meter communication method, wherein the digital power meter communication method comprises:
- receiving a digital power meter communication instruction to communicate with a target digital power meter, which is electrically connected with a target network communication device;
- constructing a virtual tunnel to build connection with the target network communication device;
- providing a storage unit, which stores a plurality of pieces of electrical connection information and a plurality of digital power meter communication programs, wherein the pieces of the electrical connection information records electrical connections between the terminal network communication devices and the terminal digital power meters, and each of the digital power meter communication programs corresponds to a predefined digital power meter model;
- determining if the target network communication device is one of the terminal network communication devices; and
- obtaining a target power meter communication program corresponding to the target network communication device from the digital power meter communication programs stored in the storage unit according to the target network communication device, loading the obtained target power meter communication program, and executing the digital power meter communication instruction utilizing the target power meter communication program through the virtual tunnel to communicate with the target digital power meter if the target network communication device is one of the terminal network communication devices.

16. The non-transitory computer-readable storage medium of claim 15, wherein the digital power meter communication method further comprises:
- selecting one of the digital power meter communication programs stored in the storage unit and transmitting a power meter connection request to the target digital power meter through the virtual tunnel utilizing the selected digital power meter communication program to obtain a power meter connection reply from the target digital power meter if the target network communication device is not one of the terminal network communication devices; and
- identifying the selected digital power meter communication program as the one corresponds to the target digital power meter if the power meter connection reply is obtained from the target digital power meter.

17. The non-transitory computer-readable storage medium of claim 16, wherein the digital power meter communication method further comprises:
- identifying the selected digital power meter communication program as the one not corresponds to the target digital power meter if the power meter connection reply has not been obtained from the target digital power meter in a predefined time period; and transmitting the power meter connection request to the target digital power meter through the virtual tunnel utilizing another selected digital power meter communication program stored in the storage unit.

18. The non-transitory computer-readable storage medium of claim 16, wherein the digital power meter communication method further comprises:

storing electrical connection information, which records the electrical connection between the target network communication device and the corresponding model of the selected digital power meter communication program, into the storage unit when the selected digital power meter communication program is identified as the one corresponds to the target digital power meter.

19. The non-transitory computer-readable storage medium of claim 15, wherein the digital power meter communication method further comprises:

disconnecting the virtual tunnel when a disconnecting instruction is received.

20. The non-transitory computer-readable storage medium of claim 15, wherein the digital power meter communication method further comprises:

disconnecting the virtual tunnel if another instruction has not been received in an idle time threshold.

21. The non-transitory computer-readable storage medium of claim 15, wherein the digital power meter communication instruction is a reading meter instruction.

* * * * *